US010771884B2

(12) United States Patent
Mutlu et al.

(10) Patent No.: US 10,771,884 B2
(45) Date of Patent: Sep. 8, 2020

(54) ELECTRONIC DEVICES WITH COHERENT SELF-MIXING PROXIMITY SENSORS

(71) Applicant: Apple Inc., Cupertino, CA (US)

(72) Inventors: Mehmet Mutlu, Stanford, CA (US); Mark T. Winkler, San Jose, CA (US); Orit A. Shamir, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/352,588

(22) Filed: Mar. 13, 2019

(65) Prior Publication Data

US 2019/0313178 A1  Oct. 10, 2019

Related U.S. Application Data

(60) Provisional application No. 62/653,444, filed on Apr. 5, 2018.

(51) Int. Cl.
*H04R 29/00* (2006.01)
*H04R 1/10* (2006.01)
(Continued)

(52) U.S. Cl.
CPC .......... *H04R 1/1041* (2013.01); *G01J 1/0403* (2013.01); *H03K 17/945* (2013.01);
(Continued)

(58) Field of Classification Search
CPC .. H04R 1/1041; H04R 1/1016; H04R 29/001; H03K 17/945
See application file for complete search history.

(56) References Cited

U.S. PATENT DOCUMENTS 5,905,380 A * 5/1999 Weiner ............... G01S 7/02
324/637
9,344,801 B2  5/2016 Yoo et al.
(Continued)

FOREIGN PATENT DOCUMENTS

| CN | 1568452 A   | 1/2005  |
| CN | 1985235 A   | 6/2007  |
| CN | 105992564 A | 10/2016 |

OTHER PUBLICATIONS

Matsumura, K., Inami, M., & Sakamoto, D. Universal Earphones: Earphones With Automatic Side and Shared Use Detection. Proceedings of the 2012 ACM International Conference on Intelligent User Interfaces. 2012. Lisbon, Portugal.

*Primary Examiner* — Simon King
(74) *Attorney, Agent, or Firm* — Treyz Law Group, P.C.; G. Victor Treyz; Joseph F. Guihan

(57) ABSTRACT

An electronic device such as an earbud may have control circuitry mounted in a housing. The housing may have portions such as an ear portion with a speaker port through which a speaker plays audio and a stalk portion that extends from the ear portion. Proximity sensors may be formed in the electronic device. For example, one or more proximity sensors may be formed on the ear portion to detect when a user has inserted an earbud into the ear of the user and/or one or more proximity sensors may be formed on a stalk portion to detect when a user is holding an earbud by the stalk or when a user is providing finger touch input such as taps, swipes, and/or other gestures on the stalk portion. The proximity sensors may be optical proximity sensors such as coherent self-mixing proximity sensors.

21 Claims, 12 Drawing Sheets

(51) Int. Cl.
  *G01J 1/04* (2006.01)
  *H03K 17/945* (2006.01)
(52) U.S. Cl.
  CPC ......... *H04R 1/1016* (2013.01); *H04R 29/001* (2013.01); *H04R 2460/15* (2013.01)

(56) References Cited

U.S. PATENT DOCUMENTS

| | | | |
|---|---|---|---|
| 9,648,410 B1* | 5/2017 | Kratsas | H04R 1/1041 |
| 2006/0062143 A1* | 3/2006 | Bibby | G05D 1/0077 |
| | | | 370/225 |
| 2009/0174885 A1* | 7/2009 | Li | G01B 9/02072 |
| | | | 356/451 |
| 2010/0014806 A1* | 1/2010 | Lee | G02B 6/4204 |
| | | | 385/15 |
| 2011/0157599 A1 | 6/2011 | Weaver et al. | |
| 2013/0279724 A1* | 10/2013 | Stafford | H04R 1/1041 |
| | | | 381/309 |
| 2014/0270225 A1 | 9/2014 | Gether | |
| 2016/0377762 A1* | 12/2016 | Uedaira | G01V 8/12 |
| | | | 250/221 |
| 2017/0064830 A1* | 3/2017 | Jiang | H05K 1/147 |
| 2017/0093079 A1* | 3/2017 | Wagman | H04R 5/033 |
| 2017/0094389 A1* | 3/2017 | Saulsbury | H04R 1/1016 |
| 2017/0295272 A1* | 10/2017 | Gan | H04M 1/605 |
| 2018/0292568 A1* | 10/2018 | Chen | G01V 8/14 |
| 2019/0037136 A1* | 1/2019 | Downing | G01S 17/10 |
| 2019/0090068 A1* | 3/2019 | Fishman | H01S 5/18344 |

* cited by examiner

ELECTRONIC DEVICES WITH COHERENT SELF-MIXING PROXIMITY SENSORS

This application claims the benefit of provisional patent application No. 62/653,444, filed Apr. 5, 2018, which is hereby incorporated by reference herein in its entirety.

FIELD

This relates generally to electronic devices, and, more particularly, to optical sensors for electronic devices.

BACKGROUND

Electronic devices may contain optical sensors. For example, earbuds may contain optical proximity sensors based on infrared light-emitting diodes and infrared photodetectors. An optical proximity sensor may use an infrared light-emitting diode to emit infrared light. The emitted infrared light may reflect or backscatter off of an object in the vicinity of the proximity sensor. The strength of the reflected or backscattered light may be measured using an infrared photodetector to determine whether the object is near or far from the sensor. An earbud can use a proximity sensor to gather information on the operating state of the earbud such as whether the earbud has been inserted into the ear of a user.

Challenges can arise in gathering operating state information with an optical proximity sensor. For example, the intensity of emitted infrared light that is reflected or backscattered from a nearby object can be affected by the reflectivity and bidirectional reflectance distribution function (BRDF) of the object, which can lead to measurement inaccuracies.

SUMMARY

An electronic device such as an earbud may have control circuitry mounted in a housing. The housing may have portions such as an ear portion with a speaker port through which a speaker plays audio and a stalk portion that extends from the ear portion.

Proximity sensors may be formed in the electronic device. For example, one or more proximity sensors may be formed on the ear portion to detect when a user has inserted an earbud into the ear of the user and/or one or more proximity sensors may be formed on a stalk portion to detect when a user is holding an earbud by the stalk or when a user is providing finger touch input such as taps, swipes, and/or other gestures on the stalk portion.

The proximity sensors may be optical proximity sensors such as self-mixing proximity sensors. A self-mixing proximity sensor may have a coherent or partially coherent source of electromagnetic radiation. The source of radiation may, for example, be a coherent light source such as an infrared vertical cavity surface-emitting laser, a quantum cascade laser, or other laser. The self-mixing proximity sensor may also have a light detector such as a photodiode and/or other electromagnetic-radiation-sensitive element.

The control circuitry can apply a frequency-extracting transform such as a fast Fourier transform to the laser bias current signal, laser junction voltage signal, or photodiode output signal and can interpolate output from the fast Frequency transform using a curve fitting technique based on a Gaussian, sine cardinal, or any other interpolating function to produce a target distance measurement corresponding to an absolute distance between the self-mixing proximity sensor and a user's body or other external target.

Based on information from the self-mixing proximity sensors, the control circuitry can take actions such as pausing and resuming audio playback, entering and exiting a low-power sleep state, and other control operations for an earbud or other electronic device. A user may supply finger touch input or other input to one or more self-mixing sensors, a one-dimensional array of self-mixing proximity sensors, or a two-dimensional array of self-mixing sensors and the control circuitry can take action based on the input (e.g., to increase or decrease playback volume, etc.).

DETAILED DESCRIPTION

Figure 1:
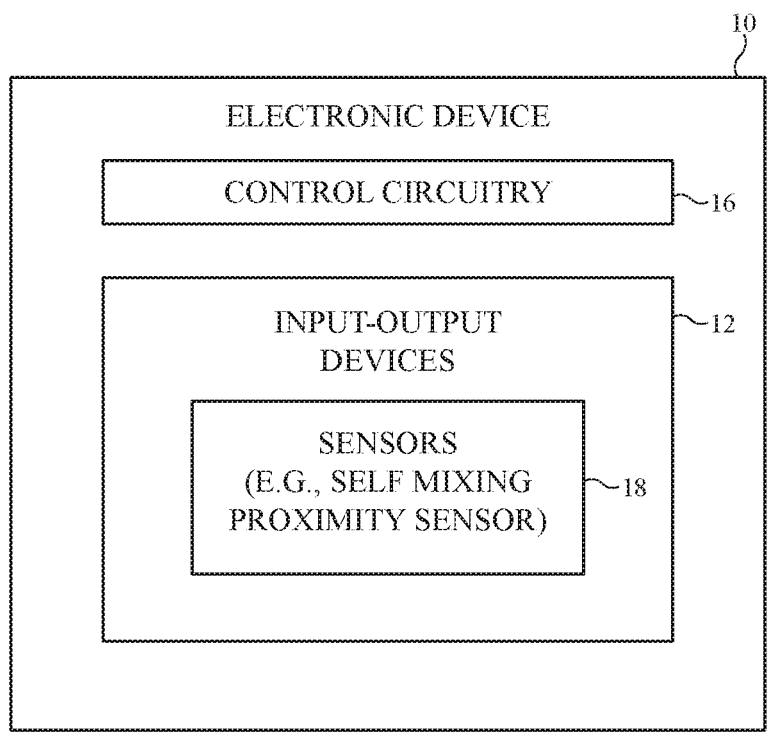
FIG. 1 is a schematic diagram of an illustrative electronic device having a self-mixing proximity sensor in accordance with an embodiment.

An illustrative electronic device of the type that may be provided with one or more optical proximity sensors such as coherent self-mixing proximity sensors is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device such as a wireless earbud, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a cover for a tablet computer or other device, a keyboard in a cover, a keyboard in a computer, a stand-alone keyboard accessory, a mouse or other pointing device, a stylus, a voice-controlled speaker device, equipment that implements the functionality of two or more of these devices, or other electronic equipment. Illustrative configurations in which electronic device 10 is an earbud may sometimes be described herein as an example.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Control circuitry 16 and input-output devices 12 may be mounted in a housing for device 10 (e.g., a housing formed from polymer, glass, ceramic, metal, silicon, germanium, zinc selenide, other materials, and/or combinations of these materials).

Input-output devices 12 may include buttons, joysticks, scrolling wheels, touch pads, key pads, keyboards, microphones, speakers, tone generators, vibrators, cameras, light-emitting diodes and other status indicators, displays, data ports, etc. A user can control the operation of device 10 by supplying commands through input-output devices 12 and may receive status information and other output from device 10 using the output resources of input-output devices 12.

Input-output devices 12 may also include sensors 18. Sensors 18 may include one or more optical proximity sensors such as an optical self-mixing proximity sensor. Sensors 18 may also include one or more additional sensors such as an ambient light sensor, a capacitive proximity sensor, a magnetic sensor, an inertial measurement unit (e.g., a sensor that includes an accelerometer, compass, and/or gyroscope for measuring motion and orientation), a force sensor, a capacitive touch sensor, a temperature sensor, a pressure sensor, a gas sensor, a microphone, or other sensors.

Figure 2:
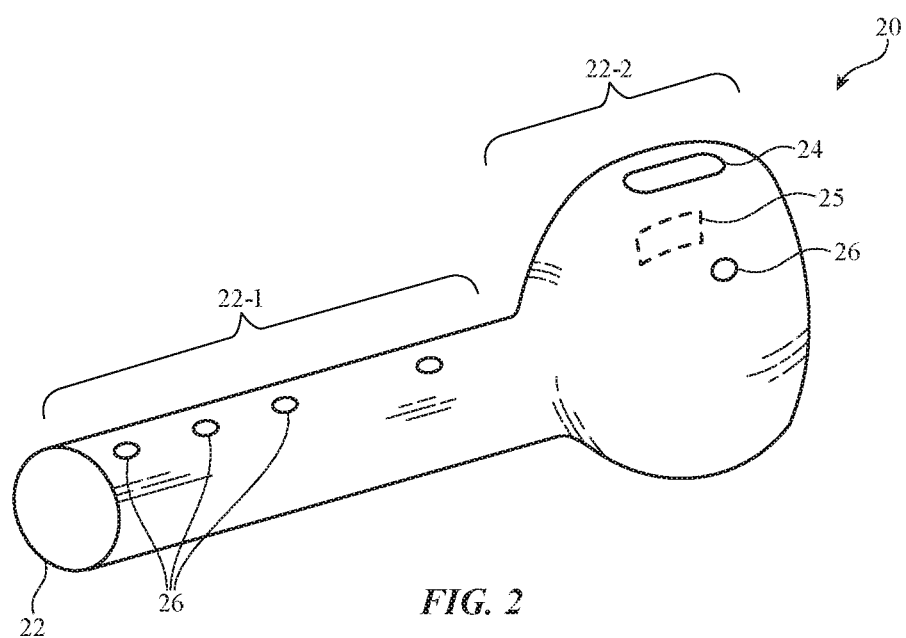
FIG. 2 is a perspective view of an illustrative earbud with a self-mixing proximity sensor in accordance with an embodiment.

FIG. 2 is a perspective view of an illustrative wireless earbud. Wireless earbud 20 may have a speaker such as speaker 25 mounted in alignment with an opening in housing 22 such as speaker port 24. Housing 22 may be formed from polymer, glass, ceramic, metal, fabric, other materials, and/or combinations of these materials. As an example, housing 22 may be formed from a rigid polymer. Housing 22 may include stalk portion 22-1 and ear portion 22-2. Speaker port 24 may be formed in ear portion 22-2, which is configured for insertion into the ear of a user. Stalk portion 22-1 may have an elongated shape that protrudes from ear portion 22-2.

During insertion of earbud 20 into an ear of a user, a user's fingers may grasp stalk portion 22-1 (as an example). Earbud 20 may have one or more proximity sensors at locations such as locations 26. The proximity sensors may be formed on ear portion 22-2 (e.g., to monitor when ear portion 22-2 is adjacent to portions of a user's ear and thereby determine when earbud 20 is in a user's ear). If desired, proximity sensors may also be formed on stalk portion 22-1. In configurations in which proximity sensors are located on stalk portion 22-1, the proximity sensors can be used to monitor when a user is grasping stalk 22-1. Stalk-mounted proximity sensors and/or proximity sensors on ear portion 22-2 (e.g., a one-dimensional or two-dimensional arrays of sensors) can also serve as a touch sensor to gather user finger input. For example, a touch sensor formed from proximity sensors may gather finger touch input such as user taps on stalk portion 22-1, user finger swipes along the length of stalk portion 22-1 and/or other user input (sometimes referred to as finger gestures or finger input).

Figure 3A:
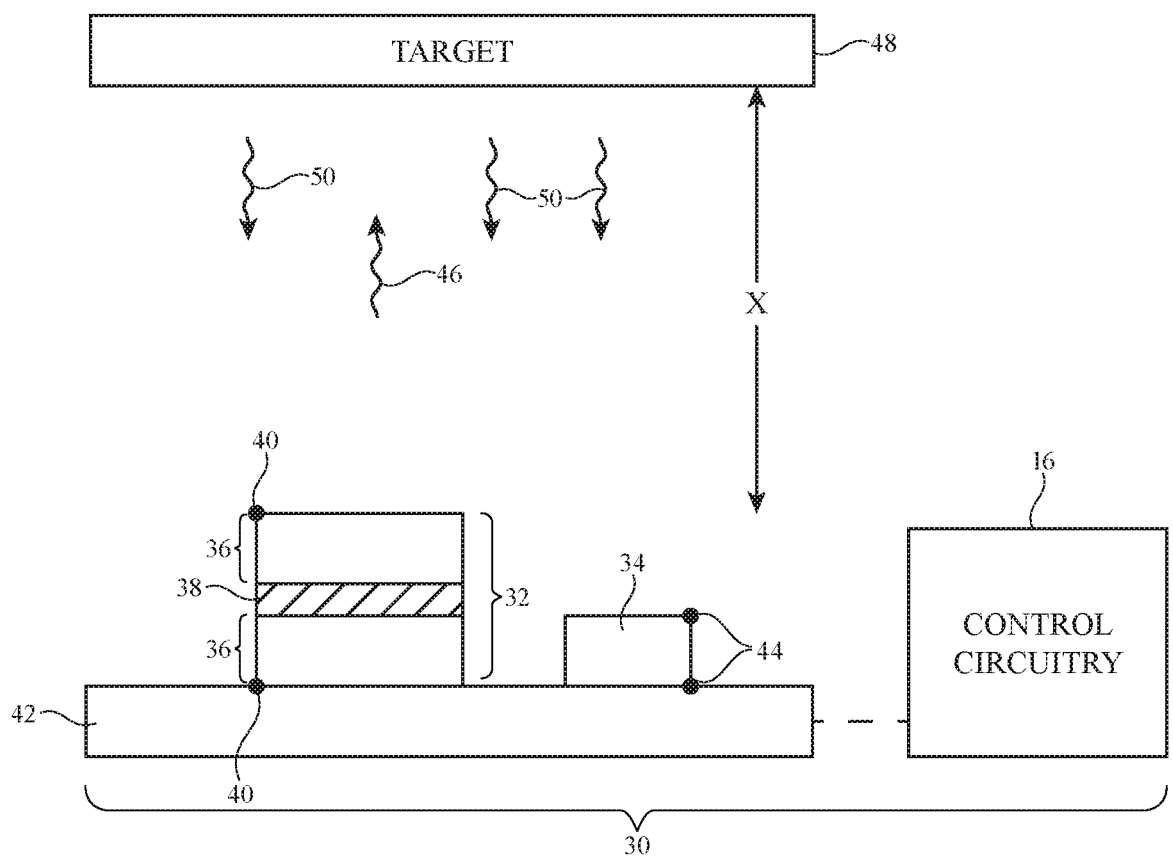
FIG. 3A is a side view of an illustrative self-mixing proximity sensor in accordance with an embodiment.

FIG. 3A is a diagram of an illustrative self-mixing proximity sensor (sometimes referred to as a self-mixing sensor or proximity sensor) and an associated target. As shown in FIG. 3A, self-mixing proximity sensor 30 may include a laser such as vertical cavity surface emitting laser 32 (e.g., self-mixing proximity sensor 30 may be a coherent self-mixing sensor having a diode laser or other coherent or partially coherent source of light or other electromagnetic radiation). Laser 32 may have thin-film interference filter mirrors 36 (sometimes referred to as Bragg reflectors) each of which is formed from a stack of thin-film layers of alternating index of refraction. Active region 38 may be formed between mirrors 36. The lower mirror in laser 32 may have a nominal reflectivity of 100% or, in configurations such as bottom-emitting configurations, may have a nominal reflectivity of less than 100%. In some cases, the laser can emit from both the top and bottom. This is particularly useful if the laser is sitting above a photodetector. The upper mirror in laser 32 may have a slightly lower reflectivity, so that laser 32 emits light 46 towards target 48. Laser 32 may be controlled by applying a drive signal to terminals 40 using control circuitry 16 (e.g., a drive circuit in circuitry 16). Sensing circuitry in circuitry 16 can measure the light output of laser 32.

Emitted light 46 may have a wavelength of 850 nm or other suitable wavelength (e.g., a visible wavelength, an ultraviolet wavelength, an infrared wavelength, a near-infrared wavelength, etc.). Target 48 may be, for example, a user's body part (e.g., ears, fingers, etc.). When emitted light 46 illuminates target 48, some of emitted light 46 will be reflected backwards towards proximity sensor 30. Proximity sensor 30 may include a light sensitive element (e.g., a light detector) such as photodiode 34. Terminals 44 of photodiode 34 may be coupled to sensing circuitry in control circuitry 16. This circuitry gathers photodiode output signals that are produced in response to reception of reflected light 50. In addition to using a photodiode, self-mixing can be detected using laser junction voltage measurements (e.g., if the laser is driven at a constant bias current) or laser bias current (e.g., if the laser is driven at a constant voltage). Target 48 is located at a distance X from proximity sensor 30.

Figure 3B:
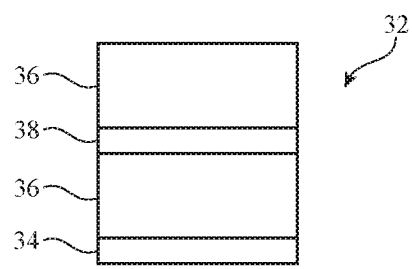
FIGS. 3B, 3C, 3D, and 3E are side views of illustrative laser and photodiode configurations for a self-mixing proximity sensor in accordance with embodiments.
Figure 3C:
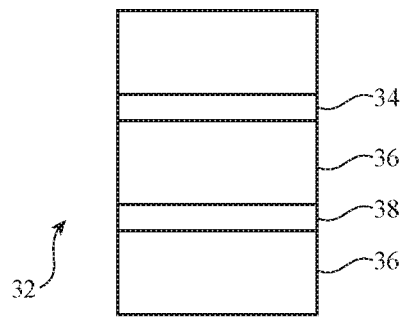
Figure 3D:
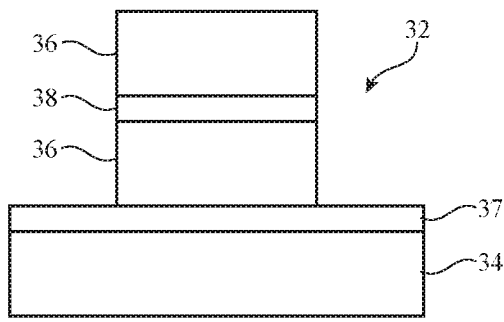
Figure 3E:
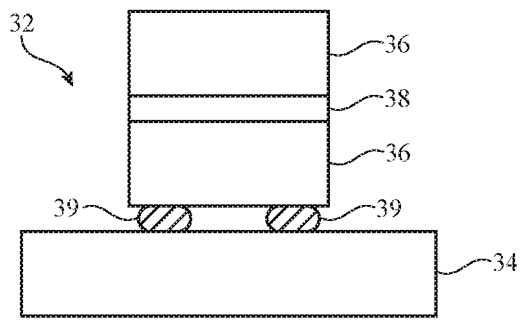

Some of light 50 that is reflected or backscattered from target 48 reenters the laser cavity of laser 32 and perturbs the electric field coherently, which also reflects as a perturbation to the carrier density in laser 32. These perturbations in laser 32 causes coherent self-mixing fluctuations in the power of emitted light 46 and associated operating characteristics of laser 32 such as laser junction voltage and/or laser bias current. These fluctuations may be monitored. For example, the fluctuations in the power of light 46 may be monitored using photodiode 34. In the example of FIG. 3A, photodiode 34 and laser 32 are formed adjacent to each other on the upper surface of substrate 42. Other configurations may be used, if desired. For example, photodiode 34 may be formed or bonded under laser 32, may be monolithically integrated into laser 32, or may be formed or bonded on top of laser 32. In the example of FIG. 3B, photodiode 34 is an integrated monolithic photodiode that is formed under laser 32. In the example of FIG. 3C, photodiode 34 is an integrated monolithic photodiode that is formed above laser 32. In the example of FIG. 3D, laser 32 has been coupled to a separate photodiode 34 using coupling structures 37 (e.g., epoxy/glue/solder). In the example of FIG. 3D, laser 32 has been coupled to separate photodiode 34 using solder bumps 39.

Figure 4:
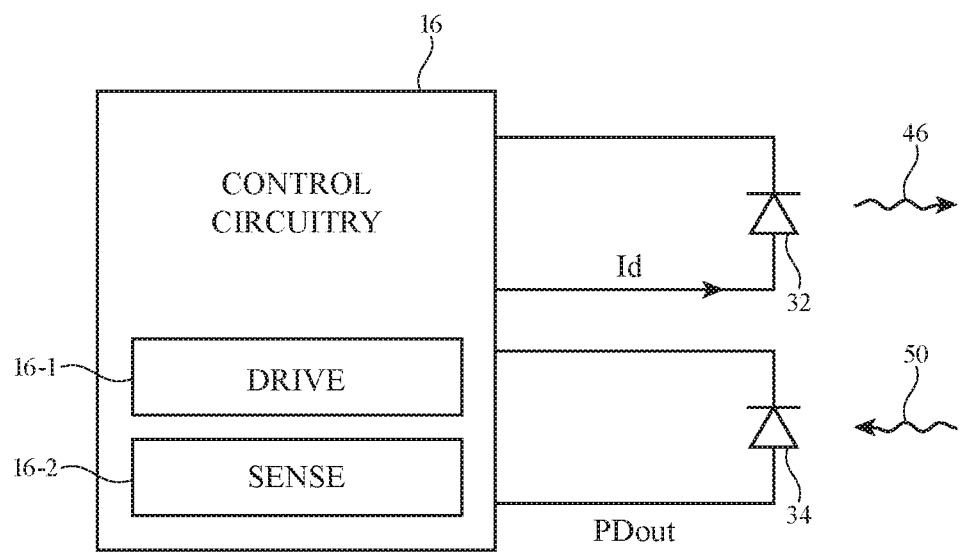
FIG. 4 is a circuit diagram of self-mixing proximity sensor circuitry in accordance with an embodiment.

As shown in FIG. 4, control circuitry 16 includes circuitry for implementing a driver for laser 32 (drive circuit 16-1) and circuitry for implementing a sensing circuit for photodiode 34 (sense circuit 16-2). Drive circuit 16-1 is used in applying a modulated drive current Id to laser 32. Sense circuit 16-2 is used in gathering signals PDout from photodiode 34 that are processed by control circuitry 16 or output signals may be gathered using junction voltage or bias current measurements.

A modulation scheme is used for driving laser 32 for the purpose of inducing a wavelength modulation and a photodiode signal processing scheme or junction voltage or bias current processing scheme is used in processing the measured self-mixing fluctuations in output power to that allow control circuitry 16 to determine the distance X between proximity sensor 30 and target 48 in accordance with the principles of self-mixing interferometry.

A modulation scheme for driving laser 32 may, for example, use a triangular wave drive signal that, due to the dependence of output wavelength on drive current magnitude of laser 32, continuously varies the wavelength of light 46 between a first wavelength WL1 and a second wavelength WL2 during each half-period of the triangular wave. The wavelength variations of light 46 cause the self-mixing interference signal of laser 32 to exhibit ripples. The processing scheme used on the photodiode signal uses a frequency extraction transform to extract the period of the ripples, from which distance X may be calculated. Distance X may, for example, be determined within less than 0.2 mm, less than 0.15 mm, less than 0.1 mm, or other suitable accuracy. Due to this high accuracy, measurements of where earbud 20 is placed within a user's ear and other measurements with proximity sensor 30 can be made with a high confidence. The frequency extraction transform can have a temporal resolution (e.g., wavelet transform) or not (e.g., Fourier transform).

Figure 5A:
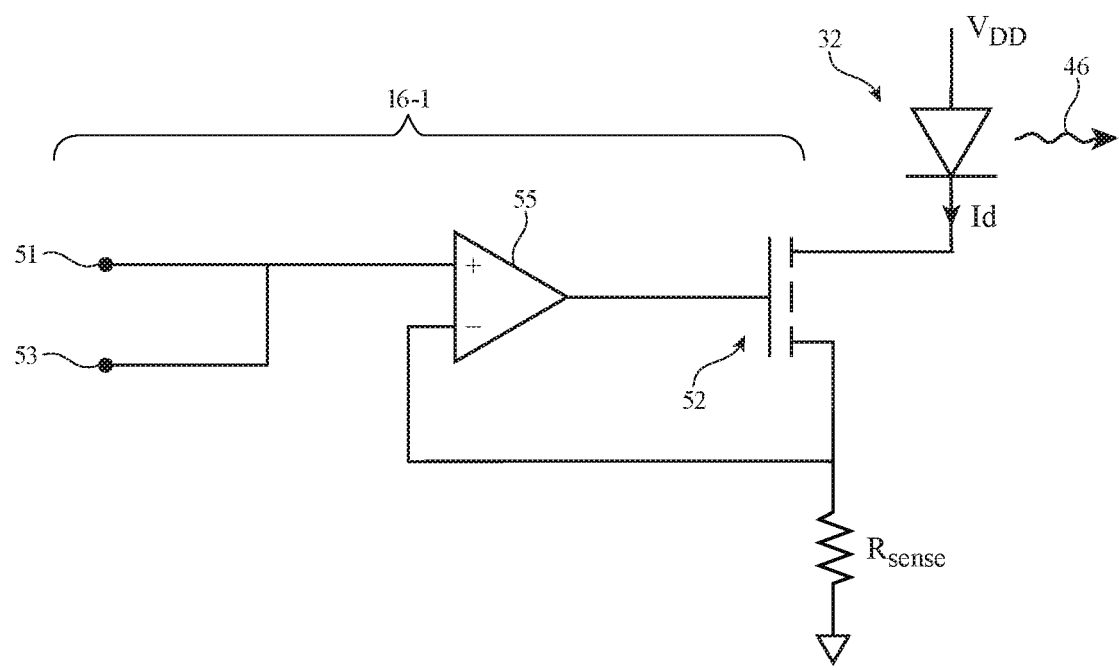
FIG. 5A is a circuit diagram of illustrative self-mixing proximity sensor driving circuitry in accordance with an embodiment.

FIG. 5A is a circuit diagram of an illustrative drive circuit for controlling the light output of laser 32. As shown in FIG. 5A, drive circuit 16-1 may have an operational amplifier such as operational amplifier 55 that is configured to form a summing amplifier. A direct-current (DC) signal is received at input 51 and an alternating-current (AC) signal is received at input 53. The signals on inputs 51 and 53 may be voltages that are adjusted to create a desired current through the Rsense resistor and through laser 32. For instance, a voltage of 5 mA*Rsense may be provided to input 51 to bias the laser at 5 mA. The AC signal on input 53 may be, for example, a triangular wave with an AC current of 1 mA peak-to-peak. The control signals supplied to inputs 51 and 53 (e.g., by voltage sources in control circuitry 16) may be summed and a resulting control voltage proportional to the sum of these input signals may be supplied to the gate of transistor 52 by the output of operational amplifier 55. In some embodiments, transistor 52 may be omitted. In some embodiments, only one of inputs 51 and 53 may exist.

Figure 5B:
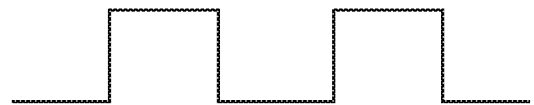
FIGS. 5B, 5C, and 5D show illustrative self-mixing proximity sensor drive signals in accordance with embodiments.
Figure 5C:
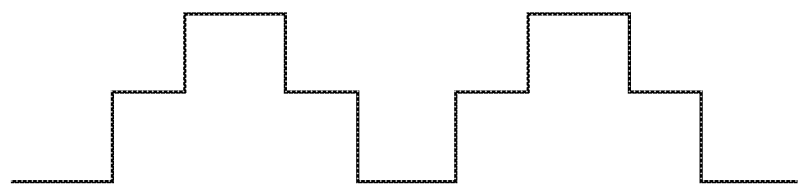
Figure 5D:
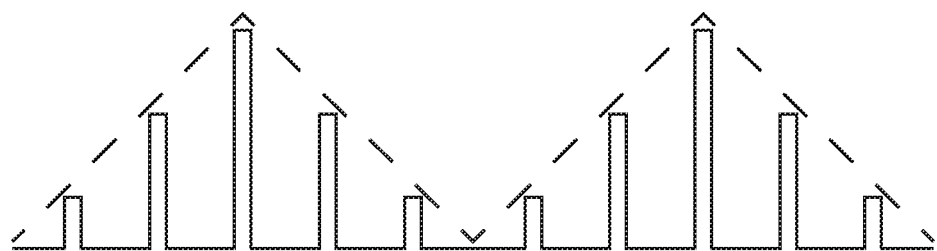

Resistor Rsense may be coupled in series with transistor 52 (e.g., the source-drain terminals of transistor 52) and laser 32 between positive power supply VDD and ground. The value of Rsense may help define the bias current component of drive current Id for laser 32. During operation, the triangle wave AC drive signal that is supplied to the gate input of transistor 52 drives a corresponding triangle wave AC drive signal (current Id) through laser 32. The frequency of the AC drive signal may be, for example, 2 kHz, 1-100 kHz, at least 100 Hz, at least 500 Hz, at least 1 kHz, at least 10 kHz, less than 200 kHz, less than 20 kHz, or other suitable frequency. If desired, other drive signals can be used such as the single-step drive signal of FIG. 5B, the two-step drive signal of FIG. 5C, or a drive signal with more than two steps. A triangle wave can also be quickly sampled. In this case the drive current appears as shown in FIG. 5D. Other drive schemes may be used, if desired.

The wavelength of light 46 that is emitted from laser 32 is affected by the refractive index and length of the laser cavity formed from mirrors 36 in laser 32. The temperature of laser 32 may vary for some driving current frequencies in accordance with the triangular wave component of drive current Id, which, in turn, modulates the output wavelength of light 46, so that the self-mixing proximity sensor can measure target distance X. If desired, other wavelength modulation techniques may be used (e.g., refractive index modulation through free carrier modulation, cavity length modulation using a microelectromechanical systems cavity length modulator, temperature modulation using a temperature controller such as a thermoelectric cooling controller, etc.). Configurations in which the refractive index of laser 32 is modulated thermally to modulate the wavelength of output light 46 are described herein as an example.

Figure 6A:
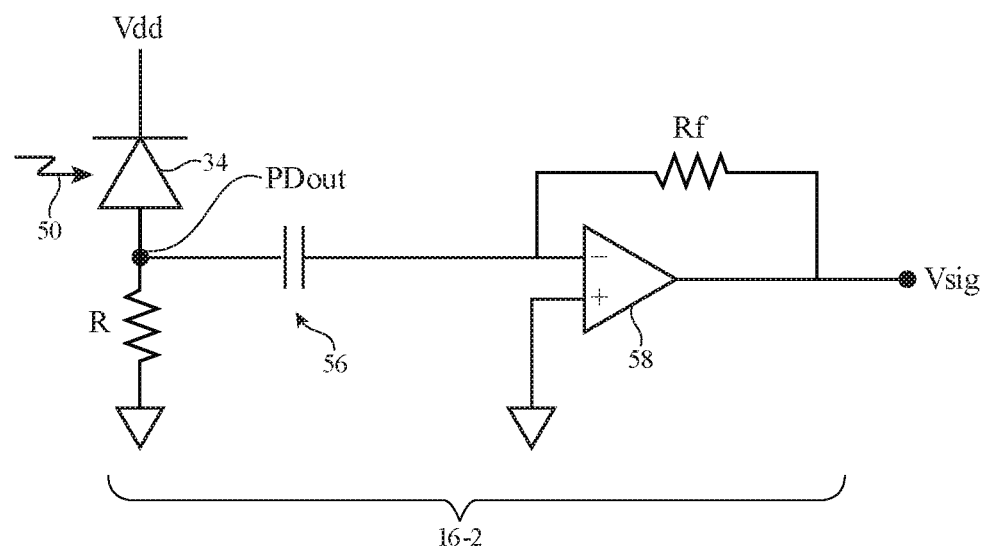
FIGS. 6A, 6B, 6C, and 6D are circuit diagrams of illustrative self-mixing proximity sensor measurement circuitry in accordance with embodiments.

FIG. 6A is a circuit diagram of an illustrative sensing circuit for photodiode 34. As shown in FIG. 6A, sense circuit 16-2 may have operational amplifier 58 and resistor Rf configured to form a transimpedance amplifier that converts current signals from photodiode 34 into output voltage Vsig. The photodiode output PDout produced in response to received light 50 may be filtered by a high-pass filter formed from resistor R and capacitor 56. Photodiode 34 and resistor R may be coupled in series between positive power supply Vdd and ground. Capacitor 56 may have a first terminal coupled to the output of photodiode 34 (e.g., the node coupling photodiode 34 to resistor R) and the input of the transimpedance amplifier formed from operational amplifier 58. Output signal Vsig can be processed using digital and/or analog processing techniques to extract distance information (target distance X) during operation of the self-mixing proximity sensor.

In other embodiments, the high-pass filter formed by resistor R and capacitor 56 may be omitted and the underlying triangular signal can be subtracted using analog or digital subtraction. In an analog arrangement, a digital-to-analog converter can synthesize a triangular wave that can be subtracted from the photodiode signal using an analog subtractor. The remaining signal can then be amplified or the photodiode signal may be directly amplified and digitized. Then, the triangle may be subtracted using a digital subtraction block.

Figure 6B:
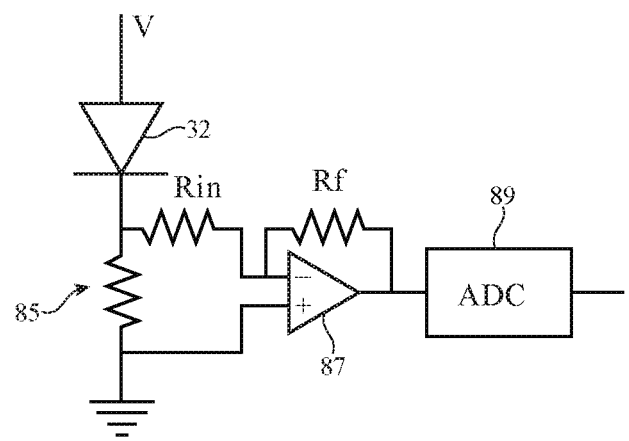

FIG. 6B is an illustrative laser current measurement circuit that may be used to measure the current of laser 32. In the example of FIG. 6B, laser 32 is coupled between power supply V and ground in series with sensing resistor 85. Amplifier 87 supplies the voltage drop across resistor 85, which is proportional to the output of laser 32, to analog-to-digital converter 89. Analog-to-digital converter 89 supplies corresponding digitized data to processing circuitry in circuitry 16 for additional processing.

Figure 6C:
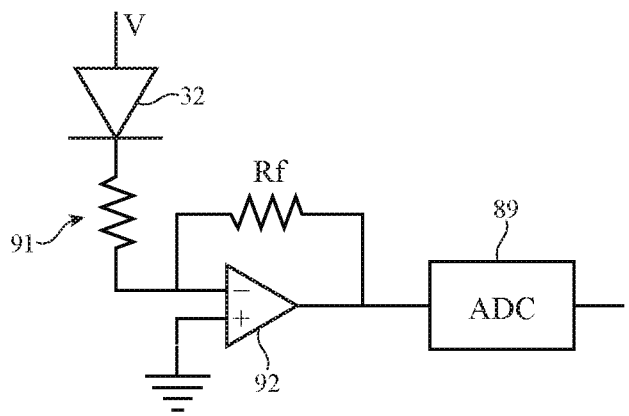

The illustrative laser current measurement circuit of FIG. 6C is an operational amplifier sensing circuit. Resistor 91 is coupled to a first terminal of operational amplifier 92. Ground or a reference voltage is connected to a second terminal of operational amplifier 92. Feedback resistor Rf is coupled between the output of operational amplifier 92 and the first input, thereby forming a transimpedance amplifier. The magnitude of resistor Rf, which influences the gain of the transimpedance amplifier can be relatively large, so the circuit of FIG. 6C may exhibit better signal-to-noise performance than the circuit of FIG. 6B.

Figure 6D:
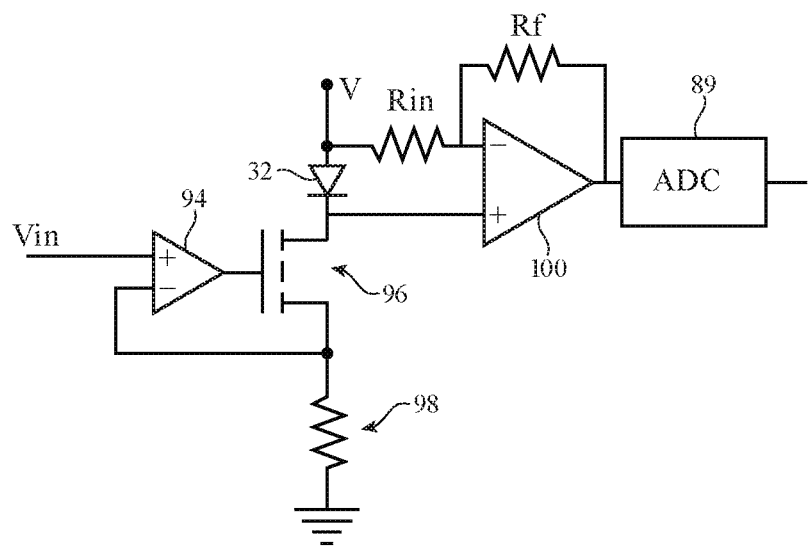

The circuit of FIG. 6D may be used to measure the voltage of laser 32. In the voltage measurement circuit of FIG. 6D, operational amplifier 94 receives control voltage Vin. The output of operational amplifier 94 is coupled to the gate of transistor 96. (In some embodiments, transistor 96 may not be used.) The negative input of operational amplifier 94 is coupled to ground through resistor 98. Operational amplifier 94 and transistor 96 form a voltage-controlled current source (e.g., a current source in which voltage Vin controls the bias current applied by transistor 96 to laser 32). In this configuration, self-mixing results in a change of the voltage of laser. This voltage is measured using voltage amplifier 100. Analog-to-digital converter 89 may be used to digitize the output signal from amplifier 100. The arrangement of FIG. 6D may allow a constant bias current to be established for laser 32 and may be satisfactory for schemes in which the light output of laser 32 is modulated.

Figure 7:
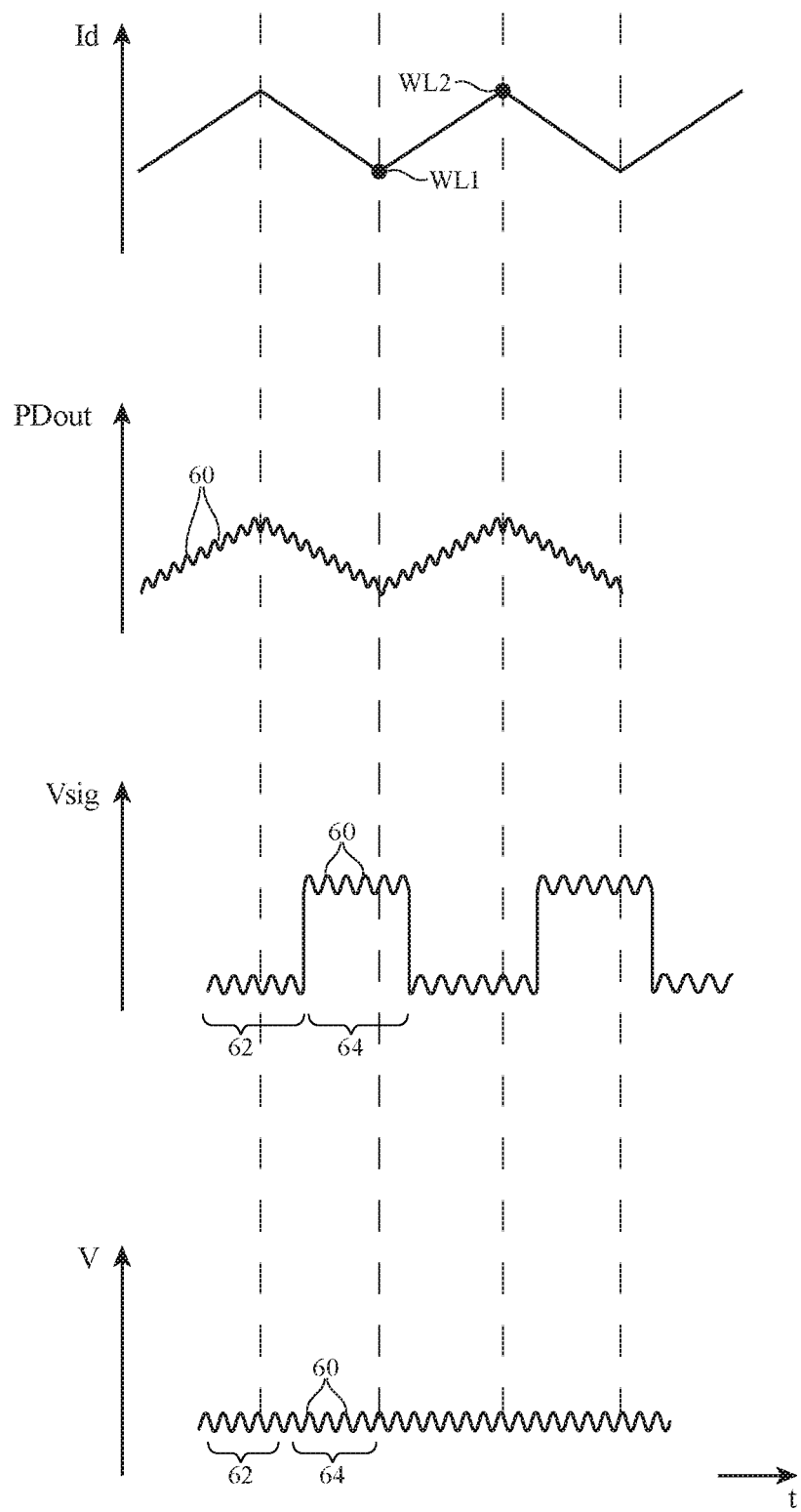
FIG. 7 is a graph of illustrative self-mixing sensor signals in accordance with an embodiment.

An illustrative signal processing approach is shown in FIG. 7.

The first (uppermost) trace of FIG. 7 shows how drive current Id may be modulated using an AC signal such as a triangle wave. This modulates the temperature of laser 32 and therefore the output wavelength of light 46. For example, the wavelength of light 46 may vary between a first value WL1 (when drive signal Id is at a minimum) and wavelength WL2 (when drive signal Id is at a maximum). In accordance with the principles of self-mixing interferometry, the modulation of the wavelength of light 46 allows the self-mixing proximity sensor to measure target distance X without varying distance X.

The second (second to uppermost) trace of FIG. 7 shows how the resulting output signal PDout from photodiode 34 contains self-mixing interference ripples 60. In configurations in which laser current or laser voltage are measured, the self-mixing interference ripples will appear in the measured current or voltage.

Sense circuit 16-2 (e.g., the operational amplifier circuit of FIG. 6) is configured to differentiate signal PDout (or the measured current or voltage of laser 32). As a result, signal Vsig at the output of sense circuit 16-2 is ideally a square wave onto which ripples 60 are imposed, as shown in the third (third from uppermost) trace of FIG. 7. To facilitate subsequent signal processing (e.g., processing to perform a frequency extraction transform), the mean of signal Vsig during high periods 64 may be subtracted from signal Vsig during high periods 64 (digitally or using analog circuitry in control circuitry 16), thereby equalizing the DC component in periods 62 and 64, as shown in the fourth (lowermost) trace of FIG. 7.

Figure 8:
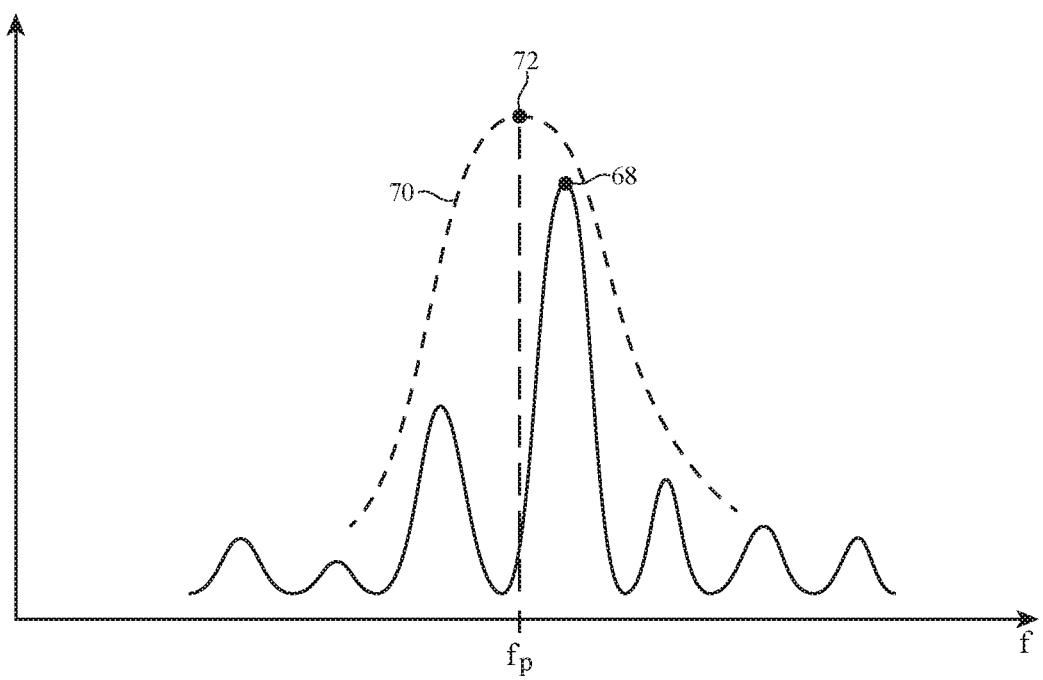
FIG. 8 is a graph in which fast Fourier transform amplitude has been plotted as a function of frequency and has been fit with a Gaussian curve in accordance with an embodiment.

A frequency-extraction transform such as a fast Fourier transform (FFT) or other frequency-extraction transform (e.g., a Hilbert transform, a continuous or discrete wavelet transform, a multiple signal classification method, etc.) may be applied to signal Vsig to determine the frequency of ripples 60. A graph in which the output of an FFT process has been plotted as a function of frequency is shown in FIG. 8. With one illustrative approach, the ripple frequency can be determined by identifying the frequency associated with the peak (e.g., peak 68) in the FFT amplitude curve of FIG. 8. Frequencies with lower peaks in the FFT output can be assumed to be associated with noise and can be ignored. A more accurate frequency assessment can be made by fitting a curve to the peaks in the curve (e.g., processing the output amplitude of the FFT algorithm at each of the output frequencies of the FFT algorithm to identify the ripple frequency). As shown in the example of FIG. 8, a curve such as Gaussian curve 70 may be fit to the frequency peaks of the output of the FFT process to accurately identify ripple frequency fp of ripples 60 (e.g., to identify frequency fp from peak 72 in Gaussian curve 70). The frequency fp may then be used in calculating target distance X.

Figure 9:
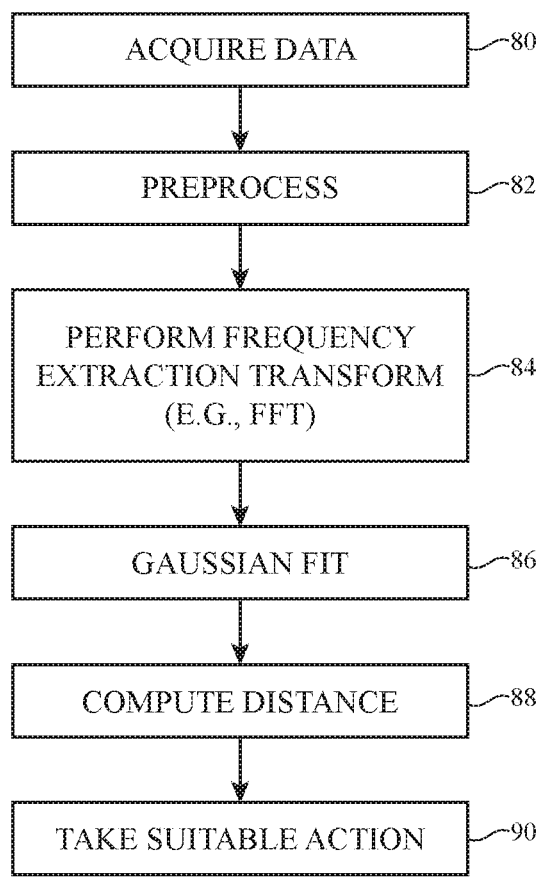
FIG. 9 is a flow chart of illustrative operations involved in gathering and using self-mixing proximity sensor measurements in accordance with an embodiment.

Illustrative operations associated with operating electronic device 10 (e.g., earbud 20) are shown in FIG. 9.

During the operations of block 80, device 10 may use control circuitry such as drive circuit 16-1 to modulate the wavelength of output light 46 from laser 32 while using control circuitry such as sense circuit 16-2 to measure corresponding self-mixing fluctuations in the output light, junction voltage, or bias current (e.g., reflected or backscattered output light 50, which shares its self-mixing intensity fluctuations with light 46). For example, drive circuit 16-1 may include a digital-to-analog circuit that supplies analog drive signals to a low-pass filter (e.g., a filter with a 10 kHz cut-off frequency) and may include a voltage-to-current converter that receives the low-pass filtered voltage from the low-pass filter and supplies a corresponding current to laser 32. For sensing, sense circuit 16-2 may include a high-pass filter such as a first-order RC filter with a cut-off frequency of 40 kHz that filters output signals from photodiode 34, a transimpedance amplifier that converts filtered output current from the high-pass filter to a voltage, and an analog-to-digital converter that can be used to gather digital data for the self-mixing fluctuations by converting the voltage to a digital signal. The transimpedance amplifier may have a bandwidth that is selected to accommodate the maximum desired distance to be measured and the applied wavelength modulation.

During the operations of block 82, preprocessing operations may be performed by control circuitry 16 (e.g., to differentiate signal PDout, to convert the square wave signal of the third trace of FIG. 7 to the signal V of the fourth trace of FIG. 7, etc.). For example, control circuitry 16 may identify the rising and falling sides of the PDout signal (FIG. 7) to facilitate subsequent processing of these segments of the PDout data using corresponding first and second fast Fourier transform operations.

Following preprocessing, control circuitry 16 (e.g., general purpose processing circuitry and/or hardwired circuitry configured to facilitate computation of a transform) can be used to perform a frequency-extraction transform on the acquired and preprocessed data. For example, a Fourier transform such as a fast Fourier transform (FFT) may applied to the preprocessed data during the operations of block 84. In particular, a first instance of an FFT may be applied to the rising side of the PDout signal and a second instance of the FFT may be applied to the falling side of the PDout signals. By applying first and second FFTs to the rising and falling segments of the PDout signal, target distance can be estimated accurately, even in scenarios in which the target is moving. The frequency-extraction transform operations of block 84 produce the FFT amplitude curve of FIG. 8. Alternatively, or in addition, time-frequency analysis methods such as continuous and/or discrete wavelet transform methods can be used for frequency analysis.

During the operations of block 86, curve fitting or other signal processing techniques may be used to identify the ripple frequency fp from the FFT output data. For example, a Gaussian curve, sine cardinal, or any other interpolation function may be fit to the amplitude peaks in the FFT output spectrum, as described in connection with FIG. 8.

During the operations of block 88, control circuitry 16 can use equation 1 to determine the absolute distance of target 48 from self-mixing sensor 30 (e.g., the value of target distance X may be determined).

$$X=\lambda^2(fp)/4\Delta\lambda\text{(triangle-wave frequency)} \quad (1)$$

In equation 1, the triangle-wave frequency is the frequency of the laser modulation signal, fp is the peak frequency obtained from the FFT, λ, is the wavelength of light 46 (e.g., wavelength WL1 of FIG. 7) and Δλ is the spread in wavelength achieved during modulation (e.g., WL2-WL1 of FIG. 7).

During the operations of block 90, control circuitry 16 may take suitable action based on the measured distance X. For example, control circuitry 16 can use coherent self-mixing proximity measurements from one or more sensors 30 and/or other sensors 18 (e.g., accelerometers that produce accelerometer data, etc.) in determining the operating state of device 10. Control circuitry 16 can then adjust the operation of device 10 based on the operating state.

For example, sensors on an earbud such as sensors 30 and/or other sensors 18 may gather data from locations 26 (e.g., locations on stalk portion 22-1 and/or ear portion 22-2) to determine whether device 10 is being held in a user's fingers, whether ear portion 22-2 is in a user's ear, etc. In earbud configurations, these determinations may be used to determine whether device 10 (e.g., earbud 20) is in a charging case, is at rest (e.g., on a table top), is being held (e.g., by the stalk in a user's fingers), is being worn in a user's ear, and/or other operating modes. In devices other than earbuds, other operating state information can be gathered. For example, in a keyboard or button that includes a self-mixing sensor 30 under each finger press location (e.g., each key location), control circuitry 16 can analyze sensor data to gather finger press data, in a configuration in which device 10 is a cellular telephone, self-mixing proximity sensor measurements may be used to determine whether the cellular telephone is resting on a table or is being pressed against the user's head, and/or in other devices self-mixing proximity sensor data may be used in determining other operating mode information.

In some configurations, self-mixing proximity sensors 30 may be used in gathering touch sensor input. For example, a one-dimensional or two-dimensional array of sensors 30 may be located on stalk portion 22-1 of housing 22 of earbud 20 or elsewhere on the housing of an electronic device. As a user's finger(s) moves over the sensors 30, touch gesture input (e.g., taps, swipes, pinch-to-zoom gestures, and/or other finger touch sensor input or touch sensor input from other body parts and/or external objects) can be gathered and used by control circuitry 16 in controlling device 10.

During the operations of block 90, control circuitry 16 can take suitable action based on the detected operating state of earbud 20 and/or other input (e.g., user touch input, other operating mode information, etc.). If, as an illustrative example, control circuitry 16 detects that a user has removed earbud 20 from the user's ear and is now holding earbud 20 in the user's fingers, control circuitry 16 can pause audio that was being played for the user by control circuitry 16 using a speaker in earbud 20. The audio playback can be automatically resumed when the user replaces earbud 20 in the user's ear. As another example, when control circuitry 16 detects that earbud 20 is in a case or is resting on a table, earbud 20 (e.g., control circuitry 16) can be placed in a low power sleep state and the speaker in earbud 20 can be temporarily deactivated. In general, any suitable actions can be taken by control circuitry 16 in response to proximity sensor measurements from proximity sensor(s) 30 and/or other sensors 18 (e.g., pausing audio playback, resuming audio playback, entering a low-power sleep state, entering a higher-power wake mode by awakening from a low-power sleep state, etc.). Finger touch input and/or other input that is received using an array of self-mixing proximity sensors can be used to adjust playback volume (e.g., as a user swipes in one direction to increase volume or another opposing direction to decrease volume), can be used as typing input (e.g., keyboard input), and/or can be used in controlling other operations in device 10.

Table of Reference Numerals

| | | | |
|---|---|---|---|
| 10 | Electronic Device | 12 | Input-Output Device |
| 16 | Control Circuitry | 16-1 | Drive Circuit |
| 16-2 | Sensor Circuit | 18 | Sensors |
| 20 | Earbud | 22 | Housing |
| 22-1 | Stalk Portion | 22-2 | Ear Portion |
| 24 | Port | 25 | Speaker |
| 26 | Locations | 30 | Proximity Sensor |
| 32 | Laser | 34 | Photodiode |
| 36 | Mirrors | 38 | Region |
| 40 | Terminals | 42 | Substrate |
| 44 | Terminals | 46 | Light |
| 48 | Target | 50 | Light |
| 51 | Input | 52 | Transistor |
| 53 | Input | 55 | Amplifier |
| 56 | Capacitor | 58 | Operational Amplifier |
| 60 | Ripples | 62 | Periods |
| 64 | High Periods | 85 | Resistor |
| 87 | Amplifier | 89 | Analog-to-Digital Converter |
| 91 | Resistor | 92 | Amplifier |
| 94 | Amplifier | 100 | Amplifier |
| 96 | Transistor | 98 | Resistor |
| 37 | Coupling Structures | 39 | Solder Bumps |

The foregoing is merely illustrative and various modifications can be made to the described embodiments. The foregoing embodiments may be implemented individually or in any combination.

What is claimed is:

1. An earbud, comprising:
   a housing;
   a speaker in the housing;
   a self-mixing proximity sensor in the housing, wherein the self-mixing proximity sensor includes a laser with a laser cavity configured to emit output light that illuminates a target and wherein a portion of the output light that has illuminated the target reenters the laser cavity and causes self-mixing fluctuations in a power of the output light; and
   control circuitry in the housing that is configured to gather proximity measurements with the self-mixing proximity sensor.

2. The earbud defined in claim 1 wherein the control circuitry is configured to take action based on the proximity sensor measurements.

3. The earbud defined in claim 2 wherein the action taken comprises an action selected from the group consisting of: audio playback pausing, audio playback resumption, entering a sleep state, and exiting a sleep state.

4. The earbud defined in claim 2 wherein the laser is a vertical cavity surface emitting laser.

5. The earbud defined in claim 1 wherein the laser is a semiconductor laser.

6. The earbud defined in claim 5 wherein the self-mixing proximity sensor includes a photodiode and wherein the control circuitry includes a drive circuit configured to modulate the semiconductor laser and includes a sense circuit configured to use the photodiode to measure the self-mixing fluctuations.

7. The earbud defined in claim 5 wherein the control circuitry is configured to detect a ripple frequency in one of: a) a junction voltage for the semiconductor laser and b) a bias current for the semiconductor laser using a frequency-extracting transform.

8. The earbud defined in claim 5 wherein the control circuitry is configured to detect a ripple frequency in one of: a) a photodiode output signal, b) a junction voltage for the semiconductor laser, and c) a bias current for the semiconductor laser using a frequency-extracting transform.

9. The earbud defined in claim 8 wherein the frequency-extracting transform comprises a Fourier transform and wherein the control circuitry is configured to fit an interpolating curve to the output of the frequency-extracting transform to detect the ripple frequency.

10. The earbud defined in claim 8 wherein the control circuitry is configured to measure a distance between the self-mixing proximity sensor and a target object using the ripple frequency.

11. The earbud defined in claim 1 wherein the control circuitry is configured to detect a ripple frequency in one of: a) a photodiode output signal, b) a junction voltage for the laser, and c) a bias current for the laser.

12. An earbud, comprising:
a housing having a speaker port;
a self-mixing proximity sensor in the housing, wherein the self-mixing proximity sensor includes a laser with a laser cavity configured to emit output light that illuminates a target and wherein a portion of the output light that has illuminated the target reenters the laser cavity and causes self-mixing fluctuations in a power of the output light;
a speaker configured to supply audio through the speaker port; and
control circuitry configured to adjust earbud operation in response to measurements from the self-mixing proximity sensor.

13. The earbud defined in claim 12 wherein the self-mixing proximity sensor includes an infrared laser.

14. The earbud defined in claim 13 wherein the control circuitry is configured to adjust earbud operation by controlling the audio.

15. The earbud defined in claim 12 wherein the control circuitry is configured to determine target distances with the self-mixing proximity sensor using a frequency transform that produces output.

16. The earbud defined in claim 15 wherein the control circuitry is configured to produce the target distances by fitting an interpolating curve to the output.

17. An earbud, comprising:
a housing having a stalk portion and an ear portion with a speaker port;
a self-mixing proximity sensor in the stalk portion, wherein the self-mixing proximity sensor includes a laser with a laser cavity configured to emit output light that illuminates a target and wherein a portion of the output light that has illuminated the target reenters the laser cavity and causes self-mixing fluctuations in a power of the output light;
a speaker configured to play audio through the speaker port; and
control circuitry configured to gather finger touch input using a measurement from the self-mixing proximity sensor.

18. The earbud defined in claim 17 wherein the self-mixing proximity sensor comprises one of multiple self-mixing proximity sensors in the stalk portion and wherein the control circuitry is configured to gather a finger touch input from a user using each of the self-mixing proximity sensors.

19. The earbud defined in claim 18 wherein each of the self-mixing proximity sensors includes a semiconductor laser.

20. The earbud defined in claim 19 wherein the control circuitry comprises a drive circuit configured to modulate each of the semiconductor lasers with a triangular wave drive signal.

21. The earbud defined in claim 17 wherein:
the laser is a vertical cavity surface emitting laser; and
the control circuitry is configured to use the self-mixing proximity sensor to measure a distance between the self-mixing proximity sensor and an external target by applying a frequency transform to a selected one of: 1) output from a photodiode configured to monitor light from the vertical cavity surface emitting laser, 2) a junction voltage of the vertical cavity surface emitting laser; and 3) a bias current for the vertical cavity surface emitting laser.

* * * * *